(12) United States Patent
Yang et al.

(10) Patent No.: US 7,358,101 B2
(45) Date of Patent: Apr. 15, 2008

(54) METHOD FOR PREPARING AN OPTICAL ACTIVE LAYER WITH 1~10 NM DISTRIBUTED SILICON QUANTUM DOTS

(75) Inventors: Tsun Neng Yang, Taoyuan (TW); Shan Ming Lan, Taoyuan (TW)

(73) Assignee: Institute of Nuclear Energy Research, Longtan Township, Taoyuan County (TW)

( * ) Notice: Subject to any disclaimer, the term of this patent is extended or adjusted under 35 U.S.C. 154(b) by 225 days.

(21) Appl. No.: 11/162,291

(22) Filed: Sep. 6, 2005

(65) Prior Publication Data

US 2007/0054426 A1   Mar. 8, 2007

(51) Int. Cl.
*H01L 21/00* (2006.01)
(52) U.S. Cl. .................. 438/21; 438/962; 257/E31.041; 257/E29.071; 977/774
(58) Field of Classification Search .................. 438/21
See application file for complete search history.

(56) References Cited

U.S. PATENT DOCUMENTS

| 6,501,091 | B1 | 12/2002 | Bawendi ................. 257/14 |
| 2004/0173812 | A1* | 9/2004 | Currie et al. ............. 257/103 |
| 2005/0111805 | A1* | 5/2005 | Hertz et al. .............. 385/125 |
| 2007/0032091 | A1* | 2/2007 | Heald et al. ............. 438/758 |
| 2007/0120141 | A1* | 5/2007 | Moustakas et al. ....... 257/103 |

FOREIGN PATENT DOCUMENTS

JP          2001267682 A  *  9/2001

* cited by examiner

*Primary Examiner*—Walter Lindsay, Jr.
*Assistant Examiner*—Abdulfattah Mustapha

(57) ABSTRACT

The present invention relates to a method for preparing an optical active layer with 1~10 nm distributed silicon quantum dots, it adopts high temperature processing and atmospheric-pressure chemical vapor deposition (APCVD), and directly deposit to form a silicon nitrite substrate containing 1~10 nm distributed quantum dots, said distribution profile of quantum dot size from large to small is corresponding to from inner to outer layers of film respectively, and obtain a 400~700 nm range of spectrum and white light source under UV photoluminescence or electro-luminescence.

3 Claims, 4 Drawing Sheets

METHOD FOR PREPARING AN OPTICAL ACTIVE LAYER WITH 1~10 NM DISTRIBUTED SILICON QUANTUM DOTS

BACKGROUND OF THE INVENTION

Current major white light emission is blue light LED plus yellow yttrium aluminum garnet (YAG) phosphor, these patents are beneficial to Nichia Chemical Corporation and German OSRAM Opto Semiconductors, such as YAG white LED patent (U.S. Pat. No. 6,066,861) for Nichia Chemical Corporation and white LED patent (U.S. Pat. No. 6,066,861) for German OSRAM Opto Semiconductors. Lite-on Electronics Co. Ltd., Everlight Electronics Co. Ltd. and Harvatek Corporation are authorized by OSRAM Opto Semiconductors since the end of 2003. However, deficient red spectrum of emitting causes poor reproducibility of red light.

For improve luminous efficiency of phosphors, Lumileds Lighting Corporation and Sandia National Laboratory (SNL) co-develop quantum dot phosphor technology (U.S. Pat. No. 6,501,091) in National Solid State Lighting Initiative of Department of Energy (DOE).

Currently, it is gradually paying respect to use silicon quantum dots for light emitting diode (LED) even use in white LED. It is base on high yield, low cost, non-toxicity and fully compatible with semiconductor processing of Silicon materials.

Silicon quantum dot contains silicon dioxide ($SiO_2$) and silicon nitrite ($Si_3N_4$) as its matrix. Current technical data shows that silicon dioxide ($SiO_2$) as matrix of silicon quantum dots only produce red light—infrared red section of spectrum.

If silicon nitrite ($Si_3N_4$) utilized as matrix, it will produce homochromatic light source of blue, green, yellow or red light etc. under the condition of varying experimental parameters. The primary processing methods today are low temperature (<500° C.) process, plasma enhanced chemical vapor deposition (PECVD) and a series of annealing process, please see M. Sopinskyy, V. Khomchenko/Current Opinion in Solid State and Material Science 7(2003) p. 97-109.

Silicon nitrite ($Si_3N_4$) is used as matrix currently, it can produce orange light source and its external quantum efficiency is greater than 1.6% (*Applied Physics Letters* 86, (2005)071909). Until now silicon quantum dots is unable to be used worldwide as optical active layer and to produced all-white spectrum (400~700 nm wavelength range) of white LED.

SUMMARY OF THE INVENTION

The present invention adopts high temperature processing and atmospheric pressure chemical vapor deposition (APCVD), it forms a thin film of silicon nitrite matrix by directly deposits on substrate, said silicon nitrite film includes 1~10 nm distributed silicon quantum dots, wherein said silicon quantum dots are ranked from large to small in size and are corresponding to from the interface of said deposited film and substrate to the surface of thin layer, and obtain a 400~700 nm range of spectrum and white light source under UV photoluminescence and electro-luminescence.

The object of this invention is to provide white light emitting film materials with silicon quantum dots, and to provide a method of preparing white light emitting film materials with silicon quantum dots by atmospheric-pressure chemical vapor deposition (APCVD) as well as annealing process.

To achieve this goal, this invention provides white light emitting film materials with silicon quantum dots which containing a transparent substrate, a silicon nitrite ($Si_3N_4$) film deposited on said substrate, wherein said silicon nitrite film having 1~10 nm distributed quantum dots, while said quantum dots on silicon nitrite film are distributed from the inside out and increasing in size.

This invention adopts thermal processing (>700° C.) to produce sub-stoichiometric silicon nitrite film, $SiN_x$. The invention utilizes sophisticated atmospheric pressure chemical vapor deposition (APCVD) which is wildly used in semiconductor processing, and chemical reaction raw materials, such as $SiH_2Cl_2$ and $NH_3$, while the deposition temperature of sub-stoichiometric nitrite film is between 700° C.~1,000° C. The chemical reaction is as follow:

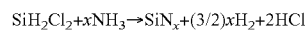

Under high temperature, after homogenously mix $SiH_2Cl_2$ and $NH_3$ at a certain moles or volume ratio, and use $H_2$, $N_2$ or Ar as carrier gas to transfer the mixture into high temperature reactor; $SiH_2Cl_2$ and $NH_3$ will be dissociated into ionic form at high temperature and recombined to form sub-stoichiometric silicon nitrite SiNx to be deposited on substrate, while the deposit contains excess silicon ion. When the deposition of sub-stoichiometric silicon nitrite film or temperature growth higher than 850° C., the silicon quantum dots will gradually transform amorphous nanocluster into nanocrystal.

DETAIL DESCRIPTION OF THE INVENTION

Figure 1:
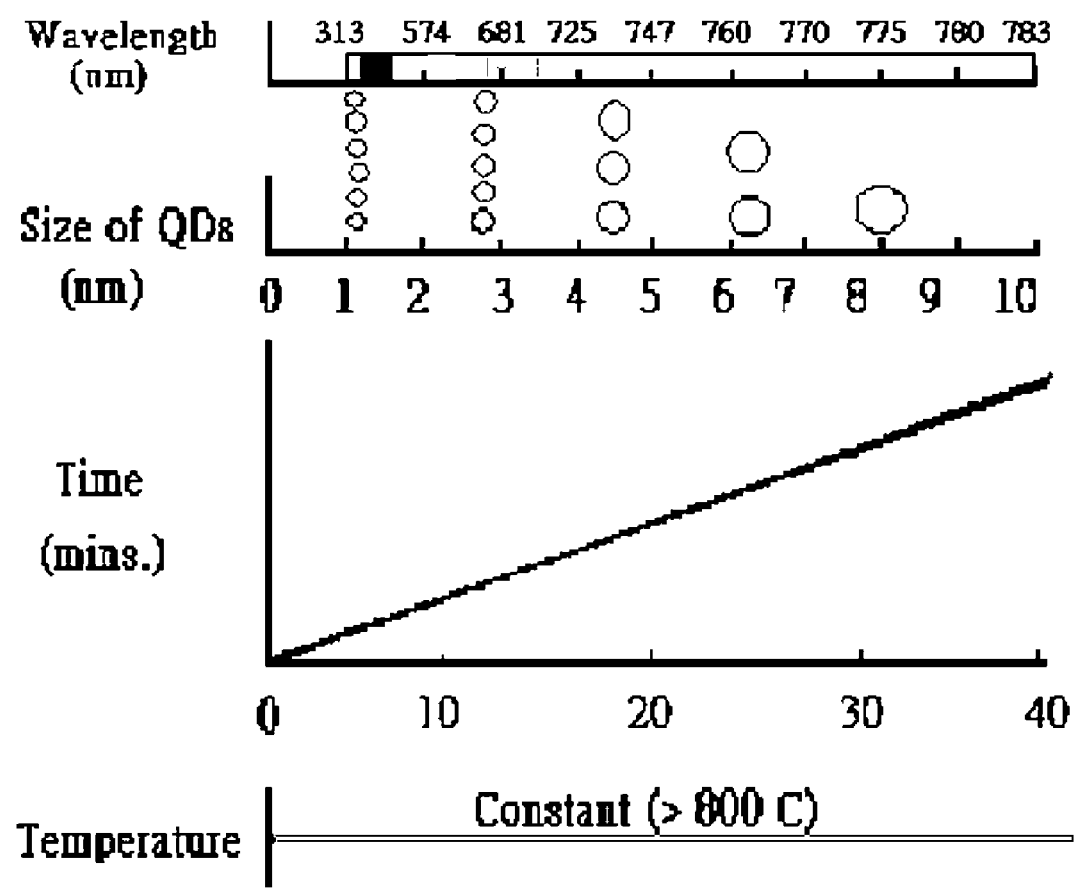
FIG. 1 illustrates Si-rich nitrite (SRN) processing of the invention.

FIG. 1 shows the silicon quantum dots, which are formed during the deposition or growth of sub-stoichiometric silicon nitrite under certain time and temperature conditions; the distribution profile of grain size from the interface of said film and substrate to the surface of film is corresponding to from large to small grains of quantum dots; the distribution curve is in linear increment; the size of said silicon quantum dots can be controlled within 1~10 nm diameter by modulating temperature and time of deposition and the ratio of silicon and nitrogen; such size of silicon quantum dots characterized by 1.5~4.0 eV bandgap, and may generate spectrum within 300~700 nm wavelength of white fluorescent light.

The substrate with deposited or grown sub-stoichiometric silicon nitrite film then put into furnace, and maintain at another annealing temperature and time under nitrogen environment for carry out all nucleation and growth of silicon nanocrystals, as well as curing process of interface structure; the result shows the luminance of white light was increased significantly.

Figure 2:
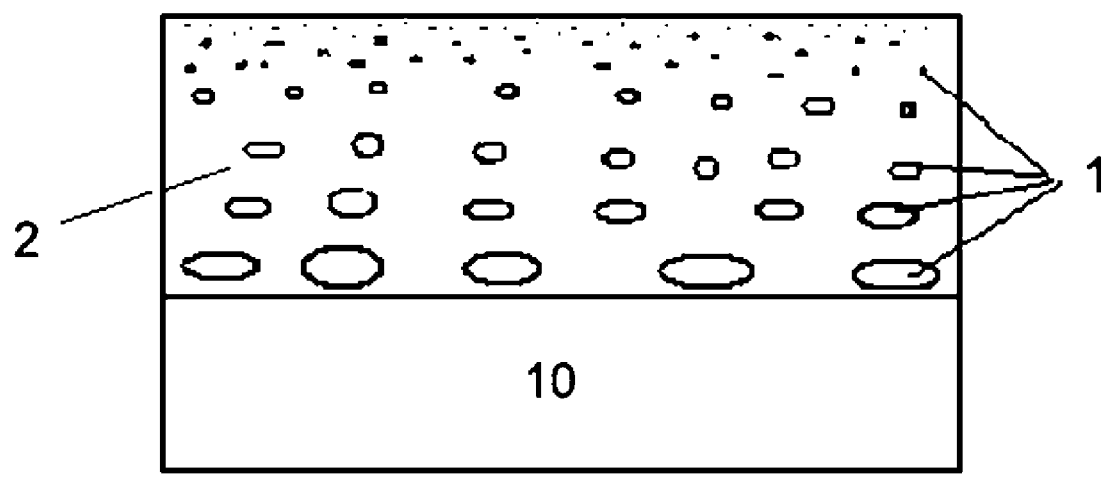
FIG. 2 is the white light emitting film with quantum dot produced by the invention.

FIG. 2 shows the silicon quantum dots 1 formed by the white light emitting film with quantum dots 1 of the present invention having a distribution profile of grain size in corresponding from the interface of said deposited film 2 and substrate 10 to the surface of film 2, from large to small and inside out, and said silicon quantum dots 1 can be controlled within 1~10 nm diameter.

Figure 3:
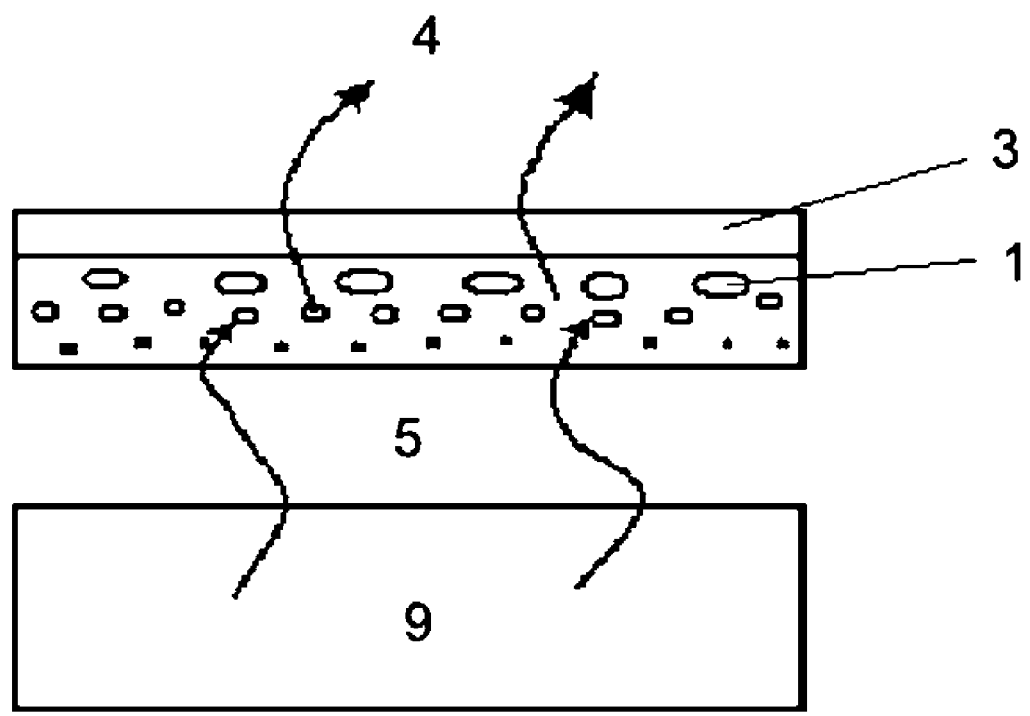
FIG. 3 is white LED of the invention obtained from UV-LED with white fluorescent film and silicon quantum dots.

FIG. 3 indicates a white LED 4 using UV-LED 9 and UV light 5 to activate a white fluorescent film and silicon quantum dots 1 and a transparent substrate 3 of the present invention.

Figure 4:
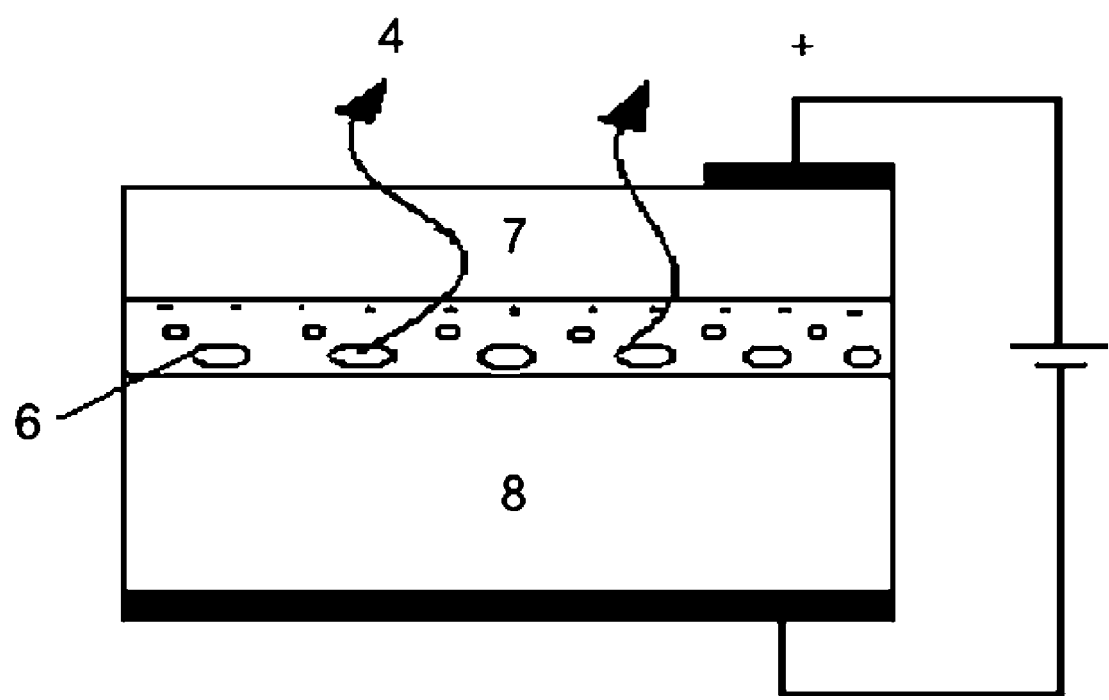
FIG. 4 is white LED of the invention obtained by forming P-N junction LED.

FIG. 4 indicates a white LED 4 to be formed with a P-N junction (7, 8) LED over a silicon quantum dots light emitting layer 6 of the present invention.

Various additional modification of the embodiments specifically illustrated and described herein will be apparent to those skilled in the art, particularly in light of the teachings of this invention. The invention should not be construed as limited to the specific form and examples as shown and described, but instead is set forth in the following claims.

What is claimed is:

1. A method for preparing white light emitting film, comprising steps providing a transparent substrate, forming a thin film of sub-stoichiometric silicon nitrite matrix by directly depositing on the transparent substrate, producing silicon quantum dots characterized by 1.5~4.0 eV band gap distributed from interface of the deposited thin film and the transparent substrate to surface of the thin film layer.

2. The method according to claim 1, wherein the deposition temperature of said sub-stoichiometric nitrite film is between 700° C. ~1,000° C.

3. The method according to claim 1, wherein the deposit contains excessive silicon ion, during the deposition of sub-stoichiometric silicon nitrite film, when temperature grows higher than 850° C., the silicon quantum dots will gradually transform from amorphous nanocluster into nanocrystal.

* * * * *